United States Patent [19]

Komatsu et al.

[11] Patent Number: 5,014,246
[45] Date of Patent: May 7, 1991

[54] SEMICONDUCTOR MEMORY DEVICE HAVING SHARED SENSE AMPLIFIER AND OPERATING METHOD THEREOF

[75] Inventors: Takahiro Komatsu; Masaki Kumanoya; Yasuhiro Konishi; Katsumi Dosaka; Yoshinori Inoue, all of Hyogo, Japan

[73] Assignee: Mitsubishi Denki Kabushiki Kaisha, Tokyo, Japan

[21] Appl. No.: 435,901

[22] Filed: Nov. 14, 1989

[30] Foreign Application Priority Data

Dec. 7, 1988 [JP] Japan ................................. 63-310324

[51] Int. Cl.⁵ ............................................... G11C 11/34
[52] U.S. Cl. .......................... 365/230.03; 365/230.06; 365/189.11
[58] Field of Search .................... 365/230.03, 230.06, 365/189.11, 189.09

[56] References Cited

U.S. PATENT DOCUMENTS 4,569,036 2/1986 Fujii et al. ...................... 365/230.03

OTHER PUBLICATIONS

Masaki Kumanoya et al., "FAM 17.2: A 90ns 1Mb Dram with Multi-Bit Test Mode," *IEEE International Solid-State Circuits Conference*, 1985, pp. 240-241.

Primary Examiner—Joseph A. Popek
Attorney, Agent, or Firm—Lowe, Price, LeBlanc, Becker & Shur

[57] ABSTRACT

A memory cell array (10) is divided into four blocks. Each block comprises a memory cell array block (10a and a memory cell array block (10b). A sense amplifier block (20) is disposed between the memory cell array blocks (10a) and (10b). Each sense amplifier block (20) is connected to the memory cell array blocks (10a) and (10b) via switching circuits (80a, 80b), respectively. Four decoders (51) are provided corresponding to the four blocks. The four decoders (51) are commonly provided with a driver (52) generating a high level driving signal. Each decoder (51) is responsive to an address signal for supplying a driving signal from the driver (52) to either one of the switching circuits (80a, 80b) and for applying a ground potential to the other one of the circuits. Accordingly, the sense amplifier block (20) is connected to either one of the memory cell array blocks (10a, 10b).

19 Claims, 10 Drawing Sheets

| SWITCHING SIGNAL GENERATING CIRCUIT | | SWITCHING SIGNAL LEVEL | | |
|---|---|---|---|---|
| No. | ROW ADDRESS SIGNAL | SWITCHING SIGNAL | RA8=H, $\overline{RA8}$=L | RA8=L, $\overline{RA8}$=H | RA8=$\overline{RA8}$=L |
| 60a | $\overline{RA8}$ | S1U | HIGHER THAN Vcc | L | Vcc |
| 60b | RA8 | S1L | L | HIGHER THAN Vcc | Vcc |

SEMICONDUCTOR MEMORY DEVICE HAVING SHARED SENSE AMPLIFIER AND OPERATING METHOD THEREOF

BACKGROUND OF THE INVENTION

1. Field of the Invention

This invention relates to a semiconductor memory device and a method of operation thereof, and more particularly to a dynamic type semiconductor memory device in which a sense amplifier is commonly used for a plurality of memory cell array blocks and an operating method thereof.

2. Description of the Background Art

FIG. 7 is a block diagram illustrating a configuration of a main section of a conventional dynamic random access memory (hereinafter referred to as DRAM) having 1M-bit memory capacity.

In a memory cell array 10 of FIG. 7, a plurality of word lines and bit lines are disposed to intersect one another, and memory cells are provided at their intersections. That is, a plurality of memory cells are arranged in a plurality of rows and columns. The memory cell array 10 is divided into four portions and each portion thereof is further divided into two memory cell array blocks 10a and 10b. The memory cell array 10 is thus divided into eight memory cell array blocks. Each of the memory cell array blocks 10a, 10b is of a 256×512 bit organization.

A row decoder 30 is disposed at the side portion of the memory cell array 10. Further, two column decoders 41 and 42 are disposed at the central section of the memory cell array 10. A decoder 30 selects any of the plurality of word lines in each memory cell array block 10a, 10b responsive to a row address signal. A plurality of memory cell array blocks 10a, 10b included in the memory cell array 10 are selected by a row address signal RA8. As shown in FIG. 7, if the row address signal RA8 is "1", four memory cell array blocks 10a (named A block) are selected and four memory cell array blocks 10b (named B block) are at a non-selected state. Conversely, if the row address signal RA8 is "0", four memory cell array blocks 10b are selected while four memory cell array blocks 10a are at the non-selected state.

A sense amplifier block 20 is disposed between the memory cell array blocks 10a and 10b in each portion of the memory cell array 10. This sense amplifier block 20 is of the configuration of a shared sense amplifier and is commonly used for two memory cell array blocks 10a and 10b. In each portion of the memory cell array 10, there is provided a switching signal generating circuit 60a generating a switching signal for connecting the sense amplifier block 20 to the memory cell array block 10a, and a switching signal generating circuit 60b generating a switching signal for connecting the sense amplifier block 20 to the memory cell array block 10b. For example, when the A block of the memory cell array 10 is selected as the row address signal RA8 is "1", the sense amplifier block 20 is connected to bit line pairs in the memory cell array block 10a responsive to a switching signal from the switching signal generating circuit 60a, while the sense amplifier block 20 is electrically separated from bit line pairs in the memory cell array block 10b responsive to a switching signal from the switching signal generating circuit 60b.

FIG. 8 is a circuit diagram illustrating the configuration of the main section of the DRAM in FIG. 7.

A plurality of bit line pairs and a plurality of word lines intersecting therewith are disposed in each of the memory cell array blocks 10a and 10b. In FIG. 8, a bit line pair BL, $\overline{BL}$ and a word line WL0 included in the memory cell array block 10a are typically illustrated, and a bit line pair BL, $\overline{BL}$ and a word line WL1 included in the memory cell array block 10b are also typically illustrated. A complementary signal appears on the bit lines BL and $\overline{BL}$. Memory cells are provided at the intersections of the bit lines and word lines. A memory cell MC provided at the intersection of the bit line BL and word line WL0, and a memory cell MC provided at the intersection of the bit line BL and word line WL1 are typically illustrated in FIG. 8. Each memory cell MC is of an one-transistor one-capacitor configuration. That is, each memory cell MC is formed of a memory capacitor Cs for storing information and an N channel MOS transistor $Q_s$.

An N channel-type sense amplifier 21 of flip-flop type and a P-channel type sense amplifier 22 of flip-flop type are provided between the memory cell array blocks 10a and 10b. These sense amplifiers 21 and 22 amplify a difference between the potentials of signals on the bit lines BL and $\overline{BL}$. The N channel-type sense amplifier 21 is formed of N channel-type MOS transistors Q21 and Q22 while the P channel-type sense amplifier 22 is formed of P channel-type MOS transistors Q24 and Q25. These sense amplifiers 21 and 22 are activated by sense amplifier activating signals S0 and S0. An N channel type MOS transistor Q23 is turned on responsive to a sense amplifier activating signal S0 while a P channel-type MOS transistor Q26 is turned on responsive to a sense amplifier activating signal S0. Accordingly, the sense amplifier 21 discharges a bit line of low potential in the bit line pair BL, $\overline{BL}$ to a ground potential, while the sense amplifier 22 charges a bit line of high potential in the bit line pair BL, $\overline{BL}$ to a supply potential $V_{CC}$. Each sense amplifier block 20 in FIG. 7 is formed of a plurality of N channel-type sense amplifiers and P channel-type sense amplifiers.

Since the memory cell array blocks 10a, 10b and the sense amplifier block 20 are of a shared sense amplifier configuration, there are provided a switching circuit 80a for electrically separating or connecting the bit line pair BL, $\overline{BL}$ in the memory cell array block 10a and the sense amplifiers 21 and 22, and a switching circuit 80b for electrically separating or connecting the bit line pair BL, $\overline{BL}$ in the memory cell array block 10b and the sense amplifiers 21 and 22. A switching circuit 80a is formed of N channel-type MOS transistors Q27, Q28 while the switching circuit 80b is formed of N channel-type MOS transistors Q29, Q30. The transistors Q27, Q28 have their gates supplied with a switching signal S1U from the switching signal generating circuit 60a shown in FIG. 7, while the transistors Q29, Q30 have their gates supplied with a switching signal S1L from the switching signal generating circuit 60b shown in FIG. 7. Both switching signals S1U and S1L are usually at the level of the supply potential $V_{CC}$ (hereinafter referred to as a $V_{CC}$ level).

Now, for example, when the potential of the word line WL0 goes to the "H" level so that information is read from the memory cell MC in the memory cell array block 10a, the switching signal S1L is at the level of ground potential (hereinafter referred to as a ground level) immediately before or at the same time the potential of the word line WL0 goes to the "H" level. Accordingly, the bit line pair BL, $\overline{BL}$ in the memory cell array block 10b is electrically separated from the sense amplifiers 21 and 22. The switching signal S1U subsequently goes to a higher level than the $V_{CC}$ level, so that the transistors Q27, Q28 become fully conductive, and the bit line pair BL, $\overline{BL}$ in the memory cell array block 10a is fully connected to the sense amplifiers 21 and 22.

When a column selecting signal Y supplied from column decoders 41 and 42 shown in FIG. 7 goes to the "H" level, N channel MOS transistors Q31 and Q32 are turned on, so that the information of sense nodes N1 and N2, which are common to both the sense amplifiers 21 and 22 is transmitted to an input and output line pair I/O, $\overline{I/O}$.

Furthermore, an equalizing and precharging circuit 11 comprising N channel type MOS transistors Q33–Q35 is respectively connected to each bit line pair BL, $\overline{BL}$ of the memory cell array blocks 10a and 10b. In the standby periods before a memory cycle starts and after the memory cycle ends, the equalizing and precharging circuit 11 equalizes the potentials of respective bit lines of a corresponding bit line pair BL, $\overline{BL}$ responsive to an equalizing signal EQ, and precharges the bit line pair BL, $\overline{BL}$ to a prescribed precharging potential $V_{BL}$. As above mentioned, since the switching signals S1U and S1L are at the $V_{CC}$ level in the standby period, the sense nodes N1 and N2 of the sense amplifiers 21 and 22 are also equalized and precharged.

Thus, the switching signals S1U and S1L are both usually at the $V_{CC}$ level; however, in memory operation, in order to connect the bit line pairs in the memory cell array blocks selected by the row address signals to the sense amplifiers, it is required that one of the switching signals S1U and S1L changes to a higher level than the $V_{CC}$ level while the other changes to the ground level.

FIG. 9 illustrates a circuit diagram of a switching signal generating circuit for generating a switching signal S1U or S1L. This switching signal generating circuit comprises N channel-type MOS transistors Q41–Q47 and capacitors C11, C12. In the case of the switching signal generating circuit 60a for generating the switching signal S1U, a transistor Q45 has its gate provided with a row address signal RA8. In the case of the switching signal generating circuit 60b for generating the switching signal S1L, the transistor Q45 has its gate provided with a row address signal $\overline{RA8}$.

The operation of the switching signal generating circuit in FIG. 9 will now be described in reference to a timing chart of FIG. 10.

First of all, the operation of the switching signal circuit 60a for generating the switching signal S1U will be described. In a standby period, an input signal $\phi_P$ is at a higher level than the $V_{CC}$ level while an input signal $\phi_3$ is at the "L" level, and both the row address signals RA8 and $\overline{RA8}$ are also at the "L" level. Accordingly, transistors Q41, Q42, Q43 shown in FIG. 9 are fully on while transistors Q45–Q47 are both off. The supply potential $V_{CC}$ is applied to the drains of the transistors Q41–Q43, so that the switching signal S1U outputted from an output terminal 61 is at the $V_{CC}$ level.

When the input signal $\phi_P$ then goes to the "L" level, the transistors Q41–Q43 are turned off. However, since the transistors Q45, Q47 are off, the switching signal S1U is maintained at the $V_{CC}$ level. When the row address signal RA8 then rises to the "H" level and then the row address signal $\overline{RA8}$ is maintained at the "L" level, the transistors Q45, Q47 remain off since the row address signal $\overline{RA8}$ is supplied to the gates of the transistors Q45, Q47. When the input signal $\phi_3$ rises to the "H" level thereafter, the gate potential of the transistor Q44 is boosted by the capacitor C11 so as to be a sufficiently higher level than $V_{CC}$ level. Further, the drain potential of the transistor Q44 is boosted by the capacitor C12 to be a sufficiently higher level than the $V_{CC}$ level. Accordingly, the switching signal S1U rises to a higher level than the $V_{CC}$ level via the transistor Q44. Finally, when the input signal $\phi_P$ rises to a higher level than the $V_{CC}$ level, the switching signal S1U goes back to the $V_{CC}$ level.

As described above, when the row address signal RA8 is at the "H" level, and the row address signal $\overline{RA8}$ is at the "L" level, the switching signal S1U goes to a higher level than the $V_{CC}$ level.

The following description is about the case in which the row address signal RA8 falls down to the "L" level while the row address signal $\overline{RA8}$ rises to the "H" level. The operation until the changes of the row address signals RA8 and $\overline{RA8}$ is the same as the one mentioned above, so that a switching signal S1U is at the $V_{CC}$ level. As shown by a dashed line in FIG. 10, if the row address signal RA8 is maintained at the "L" level and the row address signal $\overline{RA8}$ rises to the "H" level, the transistors Q45, Q47 are turned on. Accordingly, as shown by another dashed line in FIG. 10, the switching signal S1U goes to a ground level via the transistor Q45. The gate potential of the transistor Q44 also goes to a ground level via the transistors Q46, Q47. When the input signal $\phi_3$ rises to the "H" level, the drain potential of the transistor Q44 is boosted to a sufficiently higher level than the $V_{CC}$ level by the capacitor C12. However, since the gate potential of the transistor Q44 is at the ground level via the transistors Q46, Q47, and an output terminal 61 is grounded via the transistor Q45, the switching signal S1U remains at the ground level.

Both the row address signals RA8 and $\overline{RA8}$ then fall down to the "L" level. The input signal $\phi_P$ remains at the "L" level at this time, so that the transistors Q41–Q43 are kept off while the switching signal S1U is maintained at the ground level. Finally, when the input signal $\phi_P$ rises to a sufficiently higher level than the $V_{CC}$ level, the switching signal S1U changes to the $V_{CC}$ level.

Thus, if the row address signal RA8 is at the "" level and the row address signal $\overline{RA8}$ is at the "H" level, the switching signal S1U goes to the ground level.

In the case of the switching signal generating circuit 60b for generating the switching signal S1L, the transistor Q45 has its gate provided with the row address signal $\overline{RA8}$ substituted for the row address signal RA8.

The operation of the switching signal generating circuits 60a and 60b is summarized in FIG. 11. That is, when all the row address signals RA8 and $\overline{RA8}$ are at the "L" level, both the switching signals S1U and S1L are at the $V_{CC}$ level. Further, when the row address signal RA8 rises to the "H" level and the row address signal $\overline{RA8}$ falls down to the "L" level, the switching signal S1U rises to a higher level than the $V_{CC}$ level and the switching signal S1L goes down to the "L" level (ground level). On the contrary, when the row address signal RA8 goes down to the "L" level and the row address signal $\overline{RA8}$ goes to the "H" level, the switching signal S1U falls down to the "L" level while the switching signal S1L rises to a higher level than the $V_{CC}$ level.

As aforementioned, in a conventional DRAM shown in FIG. 7, the switching signal generating circuit 60a having the circuit configuration of FIG. 9 is provided at each memory cell array block 10a, and the switching signal generating circuit 60 b having the circuit configuration of FIG. 9 is provided at each memory cell array block 10b. The capacitor C12 for boosting the switching signal S1U or S1L to a higher level than the $V_{CC}$ level, requires a larger area than the other elements. In the above described conventional DRAM, while boosting operations are performed in the four switching signal generating circuits 60a, they are not performed in the other four switching signal generating circuits 60b. On the contrary, while the boosting operations are performed in the four switching signal generating circuits 60b, they are not performed in the other four switching signal generating circuits 60a. Nevertheless, one switching signal generating circuit 60a and one switching signal generating circuit 60b are required for each memory cell array block 10a and 10b, respectively. Therefore, a large number of capacitors necessary for boosting operations need to be formed, so that there is a problem that a large circuit area is needed.

It can also be conceived that one switching signal generating circuit is provided for four memory cell array blocks 10a, and one switching signal generating circuit is provided for four memory cell array blocks 10b. However, in this case, the total area of capacitors included in one switching signal generating circuit is larger than the total area of capacitors included in four switching signal generating circuits having the circuit configuration of FIG. 7.

SUMMARY OF THE INVENTION

It is an object of this invention to reduce the circuit area of a semiconductor memory device.

It is another object of this invention to reduce the area of a circuit generating a switching signal for selectively connecting a shared sense amplifier in a semiconductor memory device to any of a plurality of memory cell array blocks.

It is a further object of this invention to reduce the area occupied by capacitors included in a switching signal generating circuit in a semiconductor memory device comprising a shared sense amplifier.

It is a still further object of this invention to provide an operating method which allows the area occupied by a semiconductor memory device comprising a shared sense amplifier to be reduced.

In order to achieve the above mentioned objects, a semiconductor memory device according to &.his invention comprises a memory cell array, sense amplifier means, a plurality of switching means, driving signal generating means and decoding means.

The memory cell array comprises a plurality of word lines, a plurality of bit lines provided to intersect with the plurality of word lines, and a plurality of memory cells provided at the intersections of the plurality of bit lines and word lines, the plurality of bit lines being formed of a plurality of bit line pairs. The memory cell array is divided into a plurality of memory cell array blocks. The sense amplifier means is commonly provided in a plurality of memory cell array blocks and amplifies a potential difference on each bit line pair included in each of the plurality of memory cell array blocks. The plurality of switching means are connected between the plurality of memory cell array blocks and the sense amplifier means. The driving signal generating means generates a driving signal having a prescribed potential. The decoding means supplies a driving signal from the driving signal generating means to any of the plurality of switching means in response to a prescribed selecting signal. Each of the plurality of switching means is made conductive in response to the driving signal.

In a semiconductor memory device according to this invention, driving means for supplying a driving signal to any of the plurality of switching means comprises driving signal generating means and decoding means. That is, the plurality of switching means are commonly provided with driving signal generating means, and the switching means selected by the decoding means is supplied with the driving signal from the driving signal generating means.

Accordingly, the driving signal generating means may have driving capabilities of driving the switching means selected by the decoding means. Therefore, the circuit area of the driving means which selectively makes any of the plurality of switching means conductive is reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of this invention will be described as follows in reference to the drawings.

Figure 1:
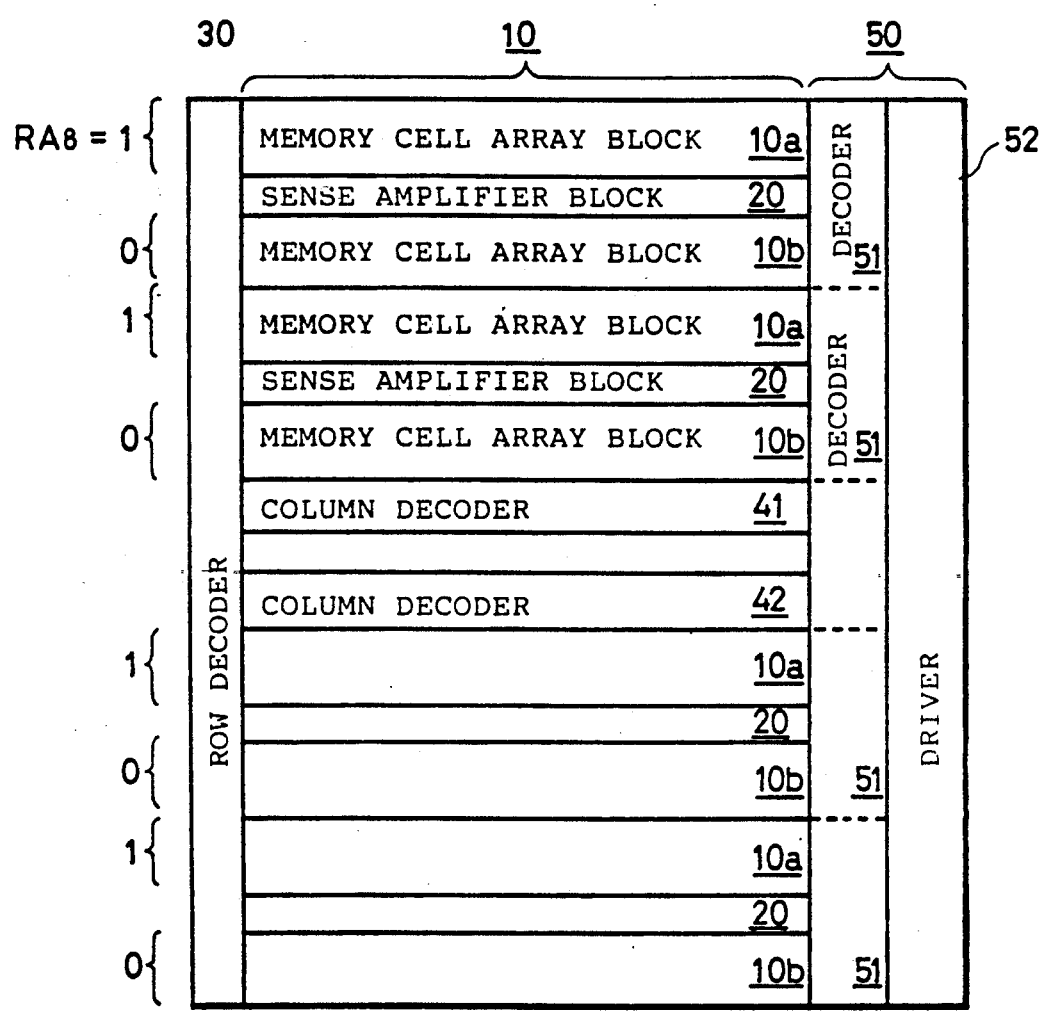
FIG. 1 is a block diagram illustrating the configuration of the main section of a DRAM according to one embodiment of this invention.

FIG. 1 is a block diagram illustrating the configuration of a DRAM according to one embodiment of this invention.

Figure 7:
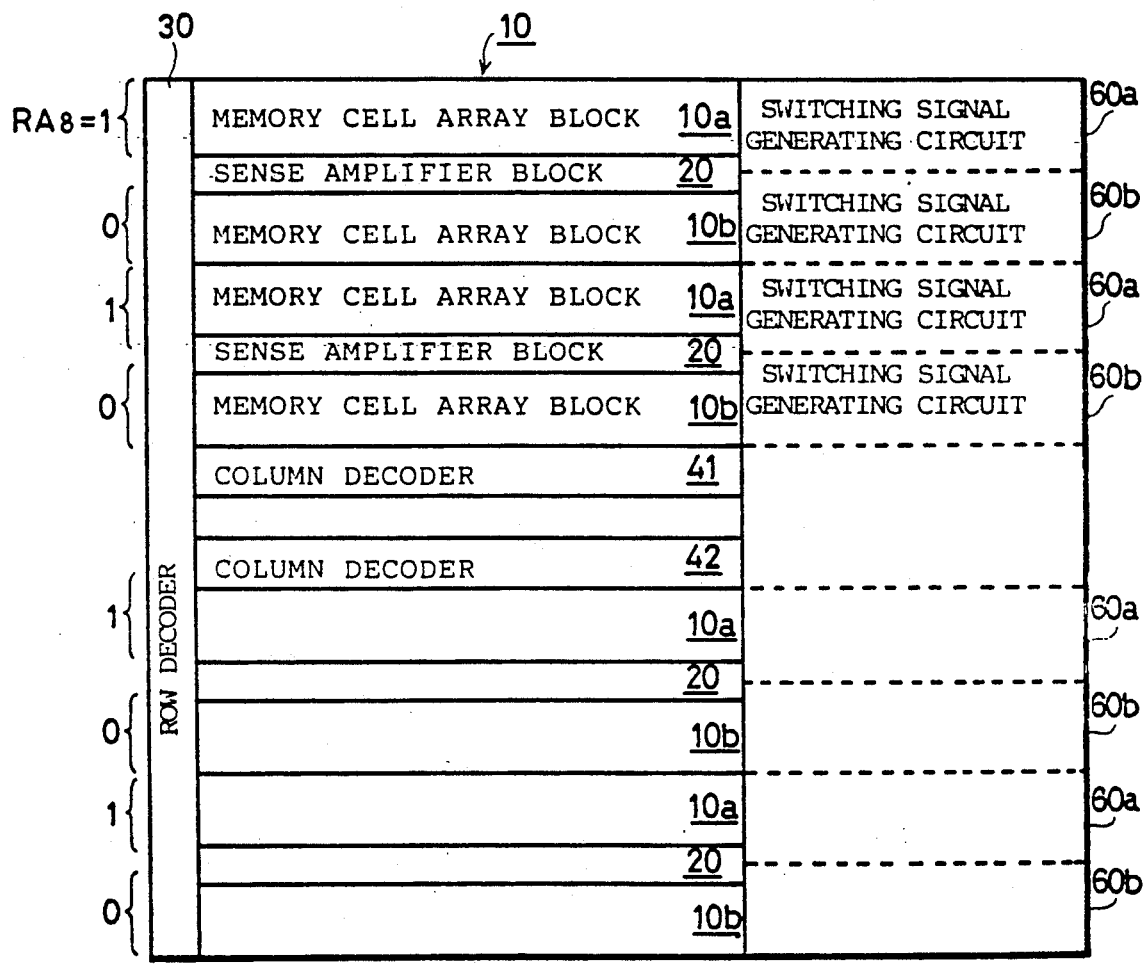
FIG. 7 is a block diagram illustrating the configuration of the main section of a conventional DRAM.

The configuration of a memory cell array 10, a row decoder 30 and a column decoders 41, 42 in FIG. 1 is the same as that of a conventional DRAM shown in FIG. 7. That is, the memory cell array 10 is divided into four sections, and each section comprises a memory cell array block 10a and a memory cell array block 10b. A sense amplifier block 20 is disposed between the memory cell array blocks 10a and 10b in each section of the memory cell array 10. Further, a row decoder 30 is disposed at the side section of the memory cell array block 10. Two column decoders 41 and 42 are disposed in the central section of the memory cell array block 10. When a row address signal RA8 is "1", A block comprising four memory cell array blocks 10a is selected, while B block comprising four memory cell array blocks 10b is not selected. On the contrary, when the row address signal RA8 is "0", B block is selected and A block is not selected.

In this embodiment, a switching signal generating circuit 50 is disposed at the opposite side to the row decoder 30 relative to the memory cell array block 10. This switching signal generating circuit 50 comprises four decoders 51 and one driver 52. Each decoder 51 is provided corresponding to a set of memory cell array blocks 10a, 10b. The driver 52 is commonly provided for the four decoders 51. The driver 52 comprises a boosting circuit for generating a driving signal in a higher level than a $V_{CC}$ level. Each decoder 51 receives a driving signal from the driver 52 to generate a switching signal for connecting the one of the corresponding memory cell array blocks 10a and 10b to the sense amplifier block 20 and separating the other from the sense amplifier block 20.

Figure 2:
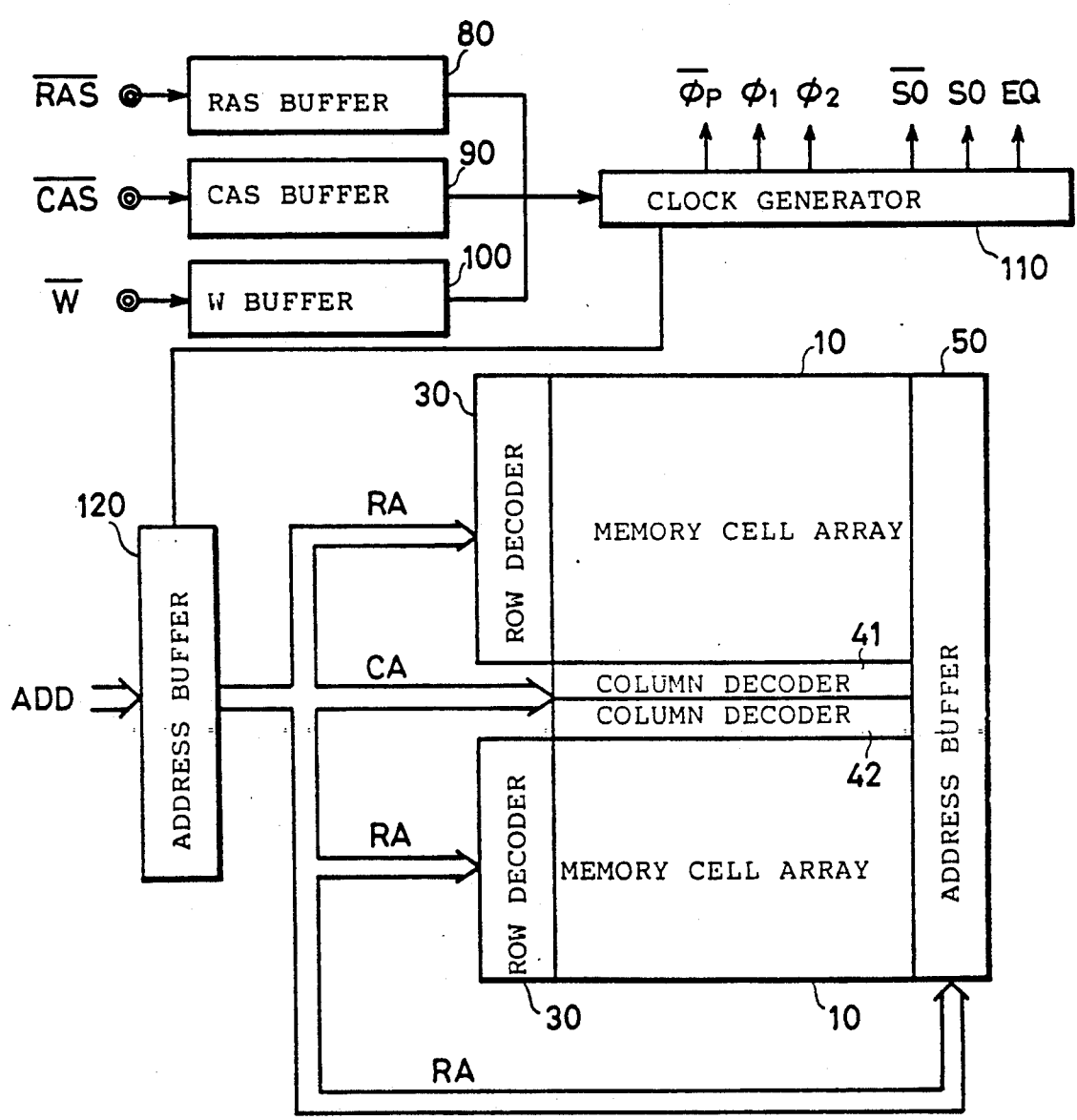
FIG. 2 is a block diagram illustrating the entire configuration of the DRAM of the embodiment.

FIG. 2 is a block diagram illustrating the entire configuration of the DRAM of this embodiment. In FIG. 2, external signals, i.e. a row address strobe signal $\overline{RAS}$, a column address strobe signal $\overline{CAS}$ and a write control signal $\overline{W}$ are supplied to a clock generator 110 via an RAS buffer 80, a CAS buffer 90 and a W buffer 100, respectively. The clock generator 110 generates different types of control signals responsive to these signals.

An address buffer 120 is responsive to a control signal from the clock generator 110 for supplying as a row address signal RA an address signal ADD which is externally provided, to the row decoders 30 and the switching signal generating circuit 50 in a given timing. Furthermore, the address buffer 120 is responsive to a control signal from the clock generator 110 for supplying as a column address signal CA an address signal ADD which is externally provided, to the column decoders 41, 42. The circuit configurations of the memory cell array block 10a, the sense amplifier block 20 and the memory cell array block 10b are identical to those shown in FIG. 8.

Figure 3:
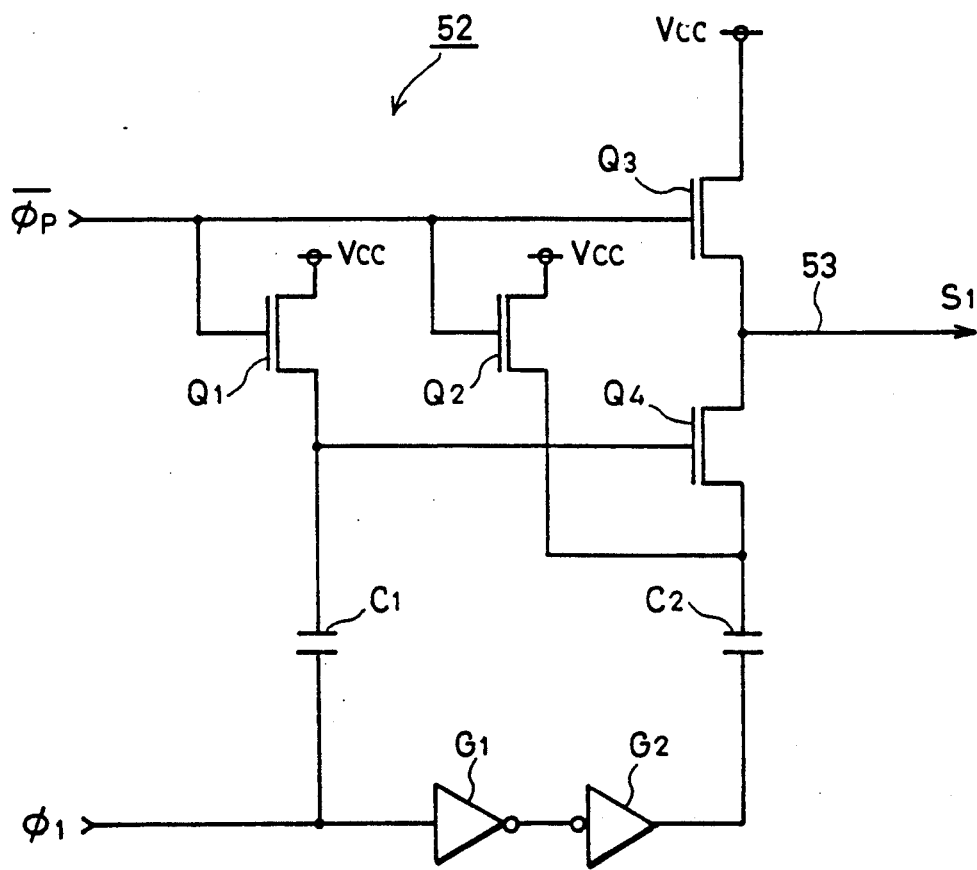
FIG. 3 is a circuit diagram illustrating the configuration of a driver included in the DRAM of FIG. 1.

FIG. 3 is a circuit diagram illustrating the configuration of a driver 52 included in the switching signal generating circuit 50.

This driver circuit 52 comprises N channel type MOS transistors Q1–Q4, capacitors C1, C2 and inverters G1, G2.

The transistors Q1–Q3 have their gates provided with an input signal $\phi_P$ and their drains provided with a supply potential $V_{CC}$. An input signal $\phi_1$ is supplied to the source of the transistor Q1 and the gate of the transistor Q4 via the capacitor C1. The input signal $\phi_1$ is also supplied to the sources of the transistors Q2, Q4 via the inverters G1, G2 and the capacitor C2. The source of the transistor Q3 and the drain of the transistor Q4 are connected to an output terminal 53. A driving signal S1 is output from the output terminal 53.

Figure 4:
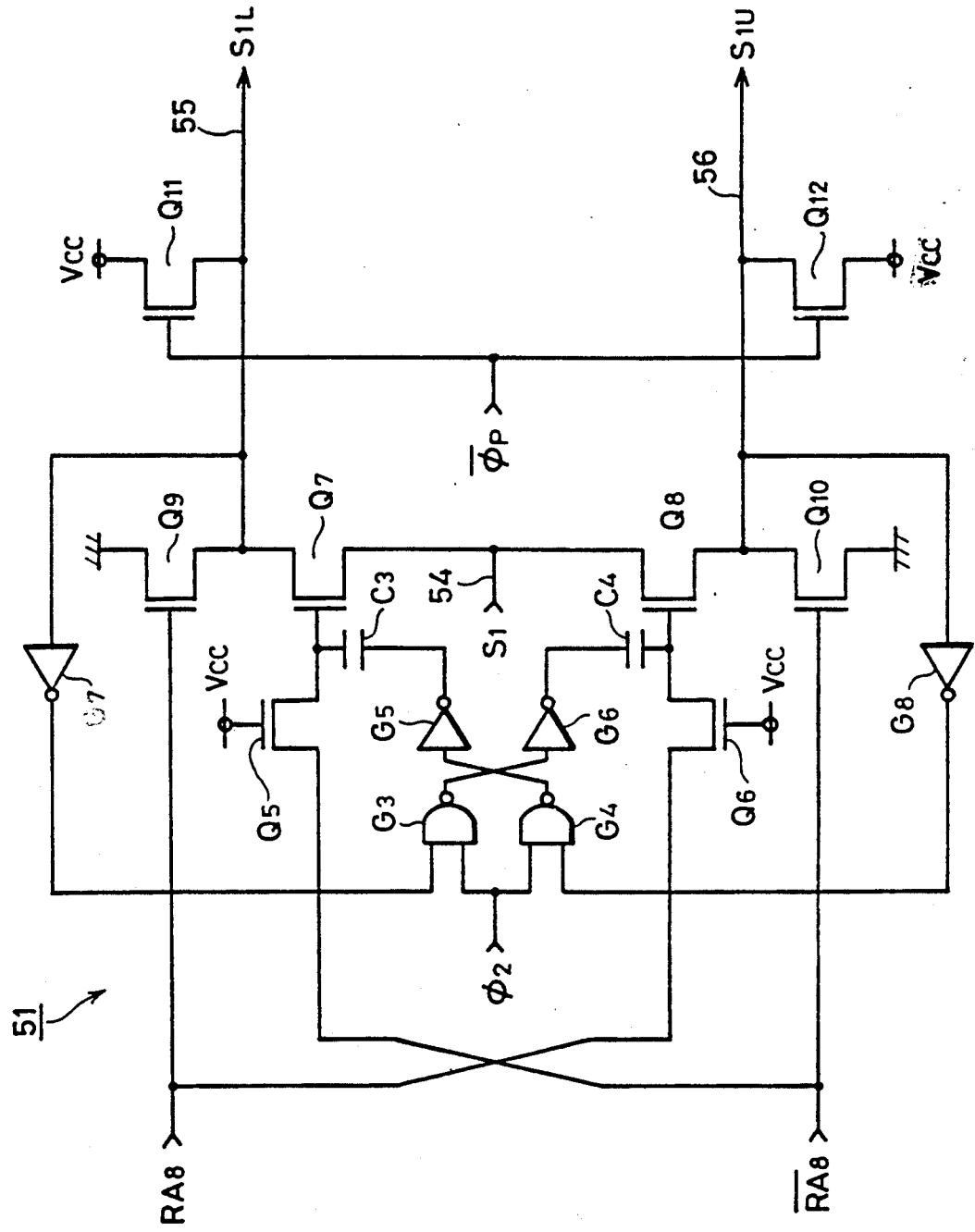
FIG. 4 is a circuit diagram illustrating the configuration of a decoder included in the DRAM of FIG. 1.

FIG. 4 is a circuit diagram illustrating the configuration of a decoder 51 included in the switching signal generating circuit 50.

This decoder 51 comprises N channel-type MOS transistors Q5–Q12, capacitors C3, C4, NAND gates G3, G4 and inverters G5–G8.

The transistor Q7 is connected between an input terminal 54 and an output terminal 55. The transistor Q8 is connected between an input terminal 54 and an output terminal 56. Moreover, the transistor Q9 is coupled between the output terminal 55 and a ground potential. The transistor Q10 is coupled between the output terminal 56 and the ground potential. Further, the transistor Q11 is coupled between a supply potential $V_{CC}$ and the output terminal 55. The transistor Q12 is coupled between the supply potential $V_{CC}$ and the output terminal 56. A row address signal RA8 is supplied to the gate of the transistor Q9 while the row address signal $\overline{RA8}$ is supplied to the gate of the transistor Q8 via the transistor Q6. A row address signal $\overline{RA8}$ is supplied to the gate of the transistor Q10 while the row address signal RA8 is supplied to the gate of the transistor Q7 via the transistor Q5.

The output terminal 55 is connected to one input terminal of the NAND gate G3 via the inverter G7. The output terminal 56 is connected to one input terminal of the NAND gate G4 via the inverter G8. The NAND gates G3, G4 have their other input terminals supplied with an input signal $\phi_2$ from the clock generator 110 in FIG. 2. The output terminal of the NAND gate G3 is connected to the gate of the transistor Q8 via the inverter G6 and the capacitor C4. The output terminal of the NAND gate G4 is connected to the gate of the transistor Q7 via the inverter G5 and the capacitor C3. The transistors Q5, Q6 have their gates supplied with the supply potential $V_{CC}$. Furthermore, the transistors Q11, Q12 have their gates provided with an input signal $\phi_P$ from the clock generator 110 in FIG. 2.

The input terminal 54 is provided with a driving signal S1 from the driver 52 of FIG. 3. A switching signal S1L is output from the output terminal 55 while a switching signal S1U is output from the output terminal 56.

Figure 5:
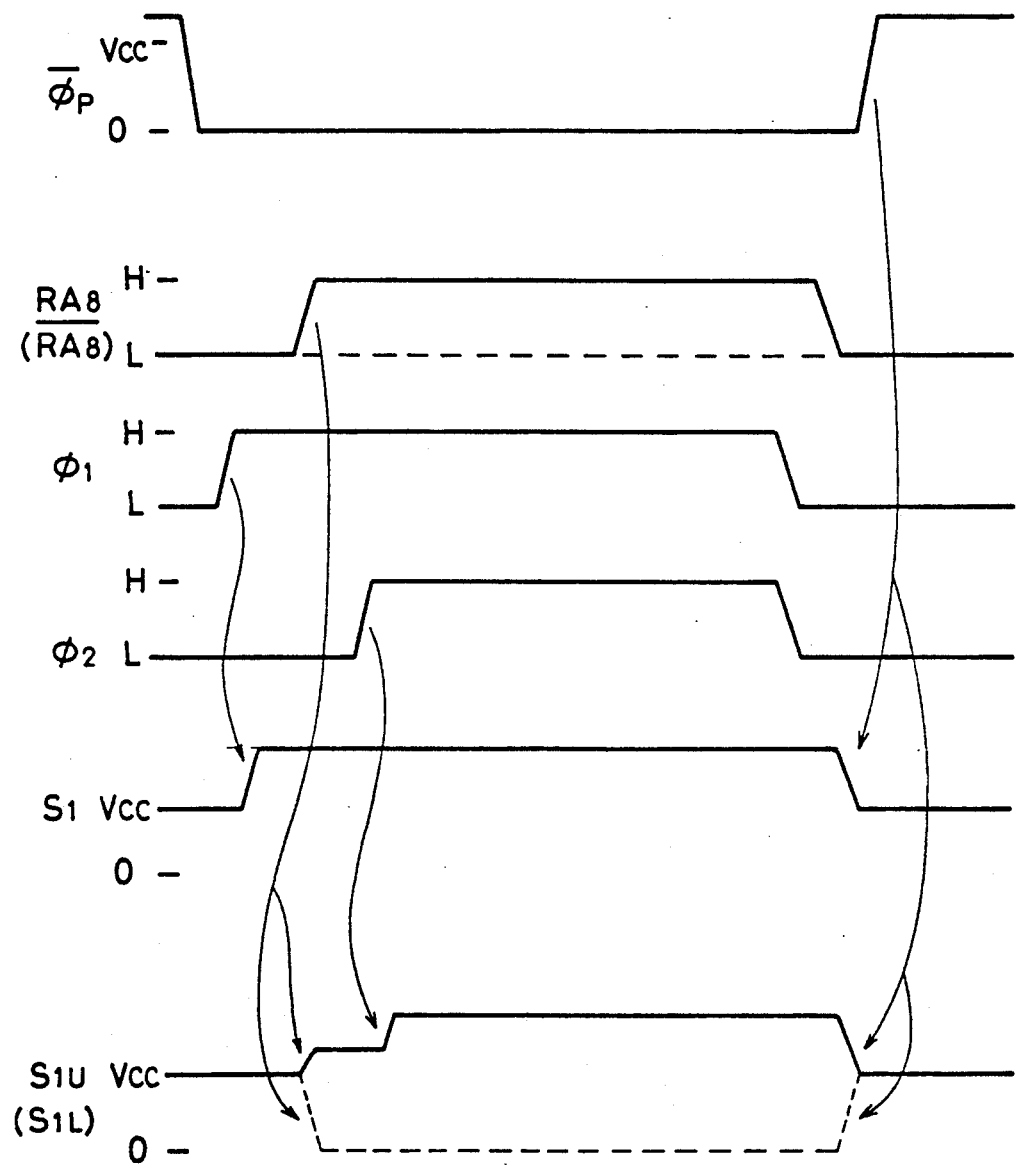
FIG. 5 is a timing chart for illustrating the operations of the driver shown in FIG. 3 and of the decoder shown in FIG. 4.

The operations of the driver 52 of FIG. 3 and of the decoder 51 of FIG. 4 will now be described in reference to a timing chart of FIG. 5.

First of all, in a standby period, an input signal $\phi_P$ is at a higher level than the $V_{CC}$ level while input signals $\phi_1$ and $\phi_2$ are both at the "L" level, and row address signals RA8 and $\overline{RA8}$ are both at the "L" level. Accordingly, the transistors Q1, Q2, Q3 in FIG. 3 are fully on, and the transistor Q4 is also on, so that a driving signal S1 is at the $V_{CC}$ level. In addition, the transistors Q11 and Q12 in FIG. 4 are fully on responsive to an input signal $\phi_P$, so that switching signals S1L and S1U are at the $V_{CC}$ level. Further, since the row address signals RA8 and $\overline{RA8}$ are both at the "L" level, the transistors Q7–Q9 are off.

When the input signal $\phi_P$ falls to the "L" level, the transistors Q1, Q2, Q3 in FIG. 3 are turned off, and the transistors Q11, Q12 in FIG. 4 are also off. In such a case, the driving signal S1 and the switching signals S1L, S1U are maintained in the $V_{CC}$ level.

When the input signal $\phi_1$ goes to the "H" level, the gate potential of the transistor Q4 in FIG. 3 is boosted to a higher level than the $V_{CC}$ level through capacitive coupling by the capacitor C1. The source potential of the transistor Q4 is also boosted to a higher level than the $V_{CC}$ level through capacitive coupling by the capacitor C2. Accordingly, the driving signal S1 rises to a higher level than the $V_{CC}$ level from the $V_{CC}$ level through the transistor Q4. On the other hand, since the row address signals RA8 and $\overline{RA8}$ are both at the "L" level, the gate potentials of the transistors Q7 and Q8 in FIG. 4 are maintained at the "L" level through the transistors Q5, Q6, respectively. Therefore, even if the driving signal S1 changes, both the switching signals S1L and S1U are maintained at the $V_{CC}$ level.

If the row address signal RA8 rises to the "H" level while the row address signal $\overline{RA8}$ is maintained at the "L" level, for example, the transistors Q8 and Q9 in FIG. 4 are turned on. Accordingly, the driving signal S1 supplied to the input terminal 54 is transmitted to the output terminal 56 so that the switching signal S1U rises up to a higher level than the $V_{CC}$. At this time, the level of the switching signal S1U is lowered by a threshold voltage $V_{TH}$ of the transistor Q8 than the level of the driving signal S1. In addition, the output terminal 55 is discharged to the ground potential, so that the switching signal S1L falls down to the ground level as shown by a dashed line in FIG. 5.

Subsequently, when the input signal $\phi_2$ rises to the "H" level, the output of the inverter G6 also rises to the "H" level. Accordingly, the gate potential of the transistor Q8 rises to a sufficiently higher level than the $V_{CC}$ level through capacitive coupling by the capacitor C4. As a result, the switching signal S1U rises to the level of the driving signal S1 through the transistor Q8.

After the input signals $\phi_1$, $\phi_2$ and the row address signal RA8 falls to the "L" level, the input signal $\phi_P$ goes back to a higher level than the $V_{CC}$ level. Accordingly, the transistor Q3 in FIG. 3 and the transistors Q11, Q12 in FIG. 4 are turned on, so that the driving signal S1 and the switching signals S1L and S1U go to the $V_{CC}$ level. This is the end of one cycle of the memory operation.

If the row address signal RA8 is at the "L" level while the address signal $\overline{RA8}$ is at the "H" level, the switching signal S1U is at the ground level and the switching signal S1L goes to a higher level than the $V_{CC}$ level, on the contrary.

Next, the read operation of the DRAM shown in FIG. 1 and FIG. 2 will be described in reference to a timing chart of FIG. 6.

First of all, when a row address strobe signal $\overline{RAS}$ externally provided falls down to the "L" level, an input signal $\phi_1$ which is applied from a clock generator 110 to a driver 52 rises to the "H" level. A driving signal S1 outputted from the driver 52 rises to a higher level than the $V_{CC}$ level responsive to the rising of the input signal $\phi_1$.

Figure 6:
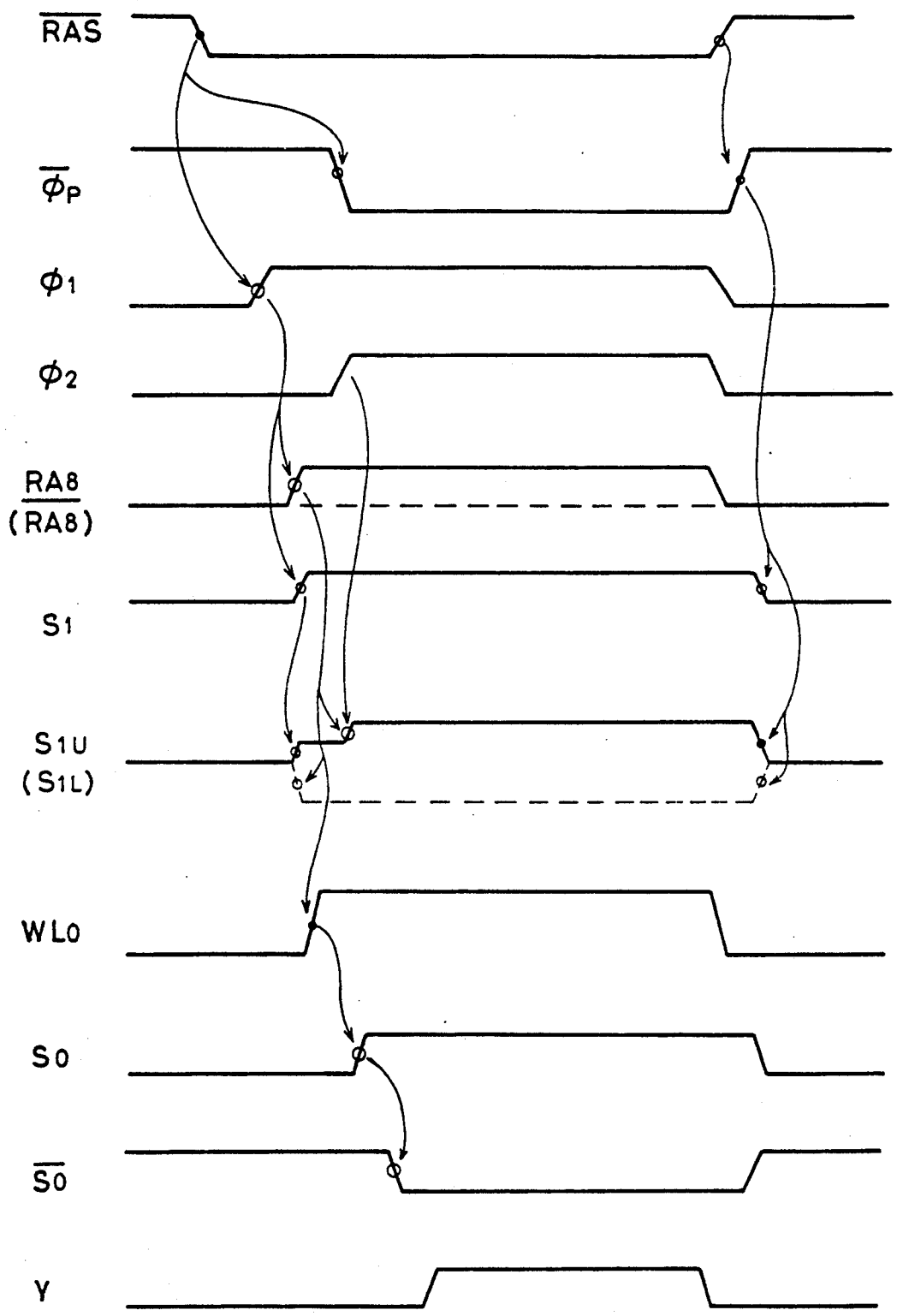
FIG. 6 is a timing chart for illustrating a read operation of the DRAM shown in FIGS. 1 through 4.
Figure 8:
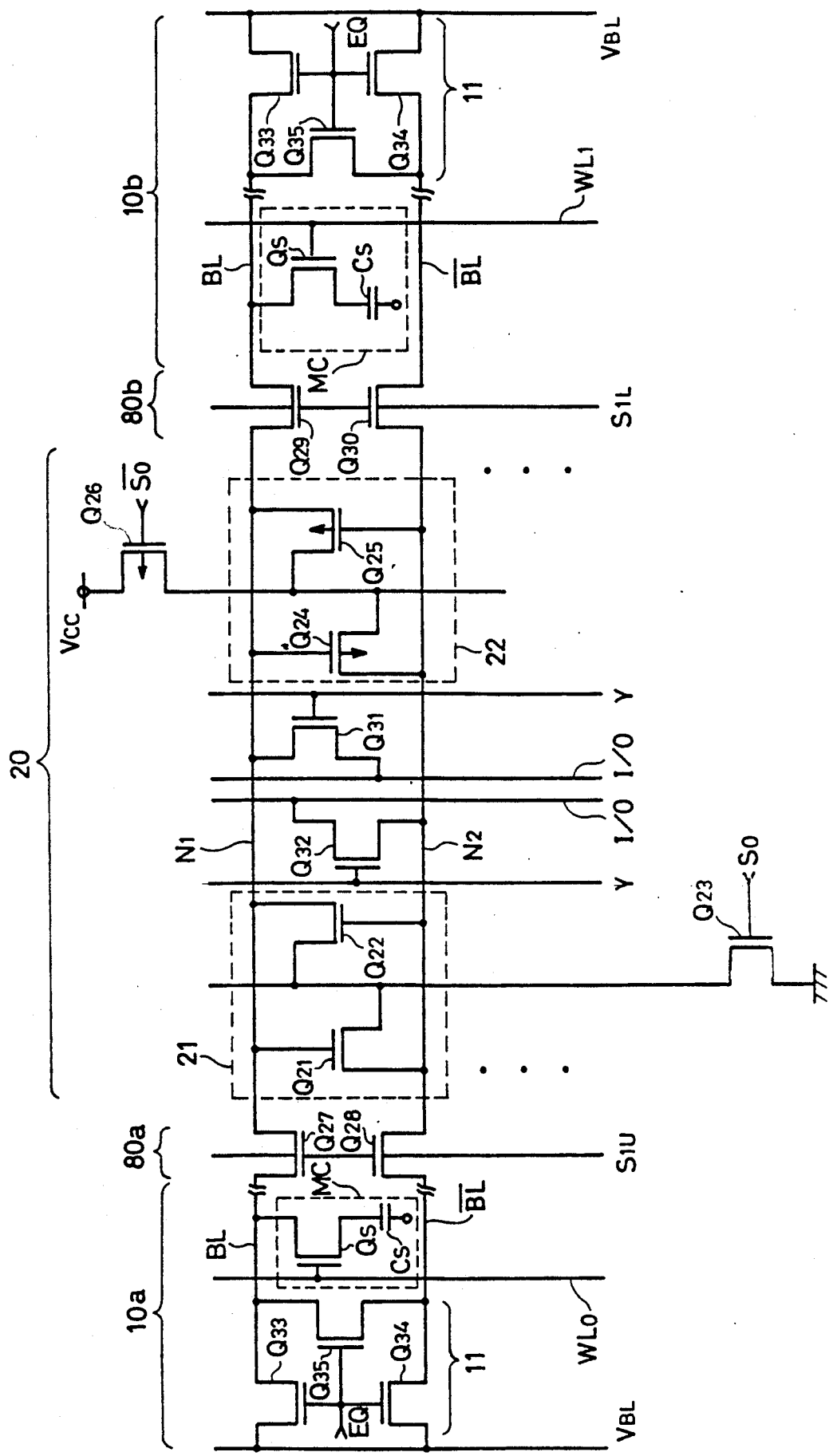
FIG. 8 is a circuit diagram illustrating the configuration of the main section of a memory cell array included in the DRAM of FIG. 1 and that of FIG. 7.
Figure 9:
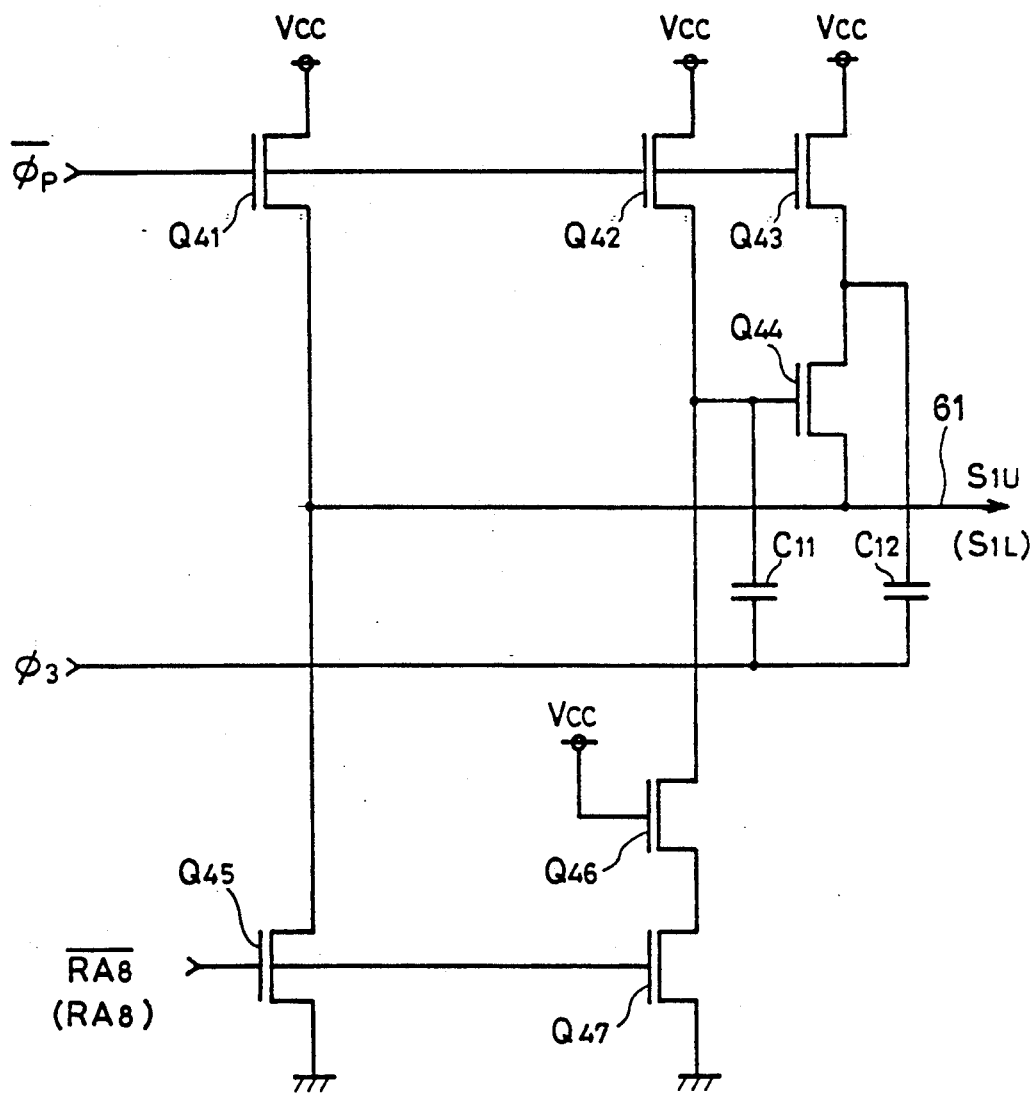
FIG. 9 is a circuit diagram illustrating the configuration of a switching signal generating circuit included in the DRAM of FIG. 7.
Figures 10, 11:
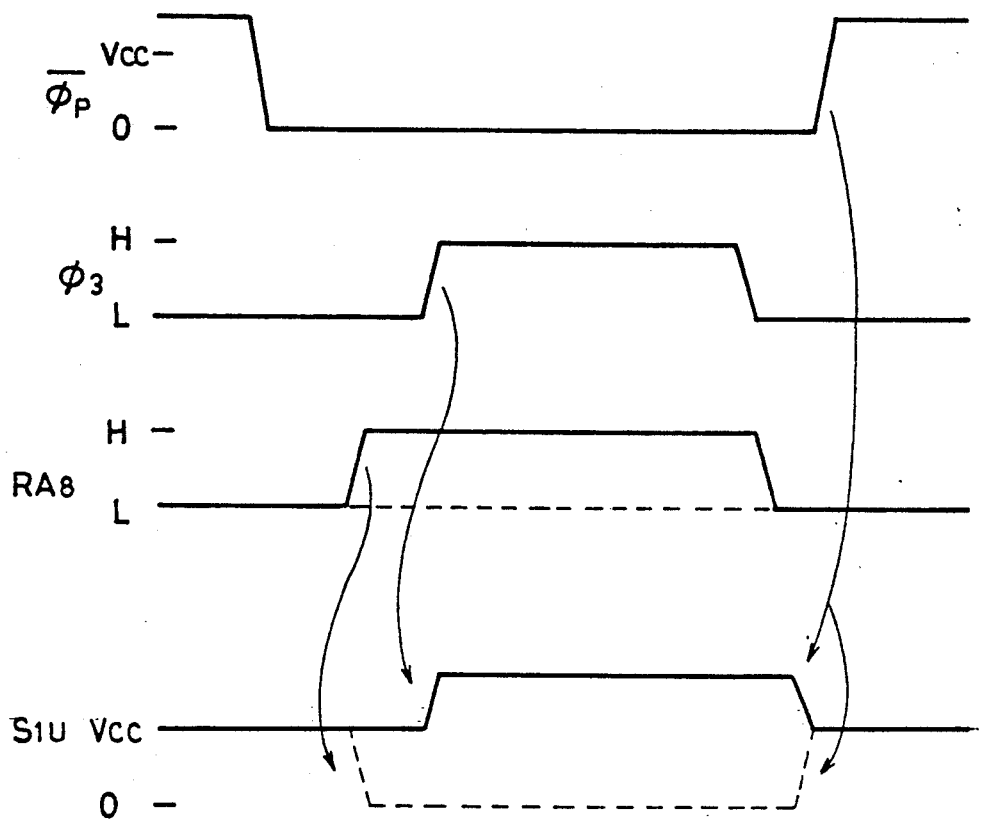
FIG. 10 is a timing chart for illustrating the operation of the switching signal generating circuit of FIG. 9.
FIG. 11 is illustrating a relationship between the level of a row address signal and that of a switching signal in the switching signal generating circuit of FIG. 9.

If the row address signal RA8 rises to the "H" level while the row address signal $\overline{RA8}$ remains at the "L" level, a switching signal S1U outputted from a decoder 51 rises to a higher level than the $V_{CC}$ level while a switching signal S1L falls down to a ground level as shown by a dashed line in the FIG. 6. As a result, the transistors Q27, Q28 in a switching circuit 80a shown in FIG. 8 are turned on, while the transistors Q29, Q30 in a switching circuit 80b are turned off. That is, the memory cell array blocks 10a shown in FIG. 1 are connected to the sense amplifier blocks 20, while the memory cell array blocks 10b are separated from the sense amplifier blocks 20.

The potential of a word line selected by a row decoder 30 then rises to the "H" level. For example, the potential of a word line WL0 rises to the "H" level as shown in FIG. 6. Accordingly, information are respectively read on the corresponding bit lines from memory cells connected to the word line WL0.

When an input signal $\phi_2$ applied from the clock generator 110 to the decoder 51 rises to the "H" level, the switching signal S1U output from the decoder 51 rises to a further higher level. Furthermore, when sense amplifier activating signals S0 and $\overline{S0}$ output from the clock generator 110 change to the "H" level and the "L" level, respectively, the sense amplifiers 21 and 22 shown in FIG. 8 start operating, so that the potential difference on each bit line pair is amplified.

A column selecting signal Y corresponding to the bit line pair selected from column decoders 41, 42 then rises to the "H" level, so that information on the selected bit line pair is transmitted to an input and output line pair I/O, $\overline{I/O}$.

When the row address strobe signal $\overline{RAS}$ externally provided rises to the "H" level, an input signal $\phi_P$ applied to the decoder 51 and the driver 52 goes back to a higher level than the $V_{CC}$ level. Accordingly, the driving signal S1 falls down to the ground level while the switching signals S1U and S1L go back to the $V_{CC}$ level.

In the above case, the potential of a sufficiently higher level than the $V_{CC}$ level is required to be applied to the gates of N channel-type MOS transistors Q27, Q28 in the switching circuit 80a, so that the potential of the "H" level is fully transmitted between the bit line pair BL, $\overline{BL}$ of the memory cell array block 10a and the sense nodes N1, N2 in FIG. 8. The input signal $\phi_2$ supplied to the decoder 51 is employed in order to raise the switching signal S1U or S1L to a sufficiently higher level than the $V_{CC}$ level. Therefore, as shown in FIG. 6, the input signal $\phi_2$ rises in earlier timing than activation of the P channel-type sense amplifier 22 which raises the potential of the bit line having higher potential to the $V_{CC}$ level. That is, the input signal $\phi_2$ rises in earlier timing than the falling of the sense amplifier activating signal $\overline{S0}$. The input signal $\phi_2$, for example, rises responsive to a trigger signal of the word line.

As aforementioned, one driver 52 having the circuit configuration of FIG. 3 and four decoders 51 having the circuit configuration of FIG. 4 are employed in the DRAM of the above described embodiment. The driving signal S1 generated from the driver 52 is supplied to four switching circuits selected by the four decoders 51. Accordingly, the capacitor C2 for boosting the driving signal S1 to a higher level than the $V_{CC}$ level may have capacitance for driving four sets of switching circuits.

Therefore, the area required for the capacitors for boosting driving signals in the above described embodiment is considerably smaller than the total area of the capacitors for boosting switching signals in the conventional DRAM. The area of the switching signal generating circuit 50 of FIG. 1 is largely occupied by the capacitor C2 for boosting a driving signal. Since the area of the capacitor C2 can be reduced, the area of the switching signal generating circuit 50 can be reduced to be smaller than the total area of the eight switching signal generating circuits 60a, 60b shown in FIG. 7.

In the above mentioned embodiment, one driver 52 is commonly used for four decoders 51; however, the number of the drivers and the decoders should not be constructed to be limitative but can be easily varied in accordance with the configuration of the shared sense amplifier.

According to this invention as described heretofore, since the driving signal generated by the driving signal generating means is supplied to the switching means selected from the decoding means, the area of a circuit forming the driving signal generating means can be reduced. Consequently, the configuration of a circuit for supplying the driving signal to the plurality of switching means can be simplified, and further the area occupied by the entire circuit thereof can be also reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
a memory cell array comprising a plurality of word lines, a plurality of bit lines provided to intersect with said plurality of word lines, and a plurality of memory cells provided at the intersections of said plurality of word lines and said plurality of bit lines, said plurality of bit lines forming a plurality of bit line pairs;
said memory cell array being divided into a plurality of memory cell array blocks;
sense amplifier means commonly provided for said plurality of memory cell array blocks, for amplifying potential differences on said plurality of bit line pairs included in each of said plurality of memory cell array blocks;
a plurality of switching means connected between said plurality of memory cell array blocks and said sense amplifier means for selectively connecting said sense amplifier means to each memory cell array block;
driving signal generating means for generating a driving signal having a prescribed potential, and
decoding means responsive to a prescribed selecting signal for supplying said driving signal from said driving signal generating means to any selected one of said plurality of switching means;
each of said plurality of switching means being conductive responsive to said driving signal.

2. A semiconductor memory device comprising:
a memory cell array comprising a plurality of word lines, a plurality of bit lines provided to intersect with said plurality of word lines, and a plurality of memory cells provided at the intersections of said plurality of word lines and said plurality of bit lines, said plurality of bit lines forming a plurality of bit line pairs;
said memory cell array being divided into a plurality of memory cell array blocks;
sense amplifier means commonly provided in said plurality of memory cell array blocks for amplifying potential differences on said plurality of bit line pairs included in each of said plurality of memory cell array blocks;
a plurality of switching means connected between said plurality of memory cell array blocks and said sense amplifier means;
driving signal generating means for generating a driving signal having a prescribed potential higher than a prescribed supply potential, said driving signal generating means being responsive to a prescribed first signal for generating said driving signal;
decoding means receiving said driving signal from said driving signal generating means and being responsive to a prescribed selecting signal for supplying said driving signal to any one of said plurality of switching means and for applying a ground potential to the rest of said plurality of switching means; wherein
each of said plurality of switching means is conductive in responsive to said driving signal and each of said plurality of switching means is non-conductive in response to said ground potential.

3. A semiconductor memory device according to claim 2, wherein
said decoding means further comprises potential raising means responsive to a prescribed second signal for raising the potential of said driving signal.

4. A semiconductor memory device according to claim 2, wherein said driving signal generating means comprises
capacitance means having one electrode and an other electrode,
first switching means responsive to a prescribed timing signal for charging said one electrode of said capacitance means to said supply potential, and
pull-up means responsive to said prescribed first signal for raising the potential of said other electrode of said capacitance means,
the potential of said one electrode of said capacitance means being output as said driving signal.

5. A semiconductor memory device according to claim 4, wherein
said driving signal generating means further comprises an output terminal, and second switching means responsive to said prescribed timing signal for applying said supply potential to said output terminal.

6. A semiconductor memory device according to claim 5, wherein
said first switching means comprises first switching element coupled between said supply potential and said one electrode of said capacitance means for being conductive responsive to said prescribed timing signal.

7. A semiconductor memory device according to claim 5, wherein
said pull-up means comprises a terminal receiving said first signal for supplying the same to said other electrode of said capacitance means.

8. A semiconductor memory device according to claim 5, wherein
said second switching means comprises a second switching element coupled between said supply potential and said output terminal for being conductive responsive to said prescribed timing signal.

9. A semiconductor memory device according to claim 5, wherein said driving signal generating means further comprises
second capacitance means having one electrode and an other electrode receiving said prescribed first signal,
a third switching element coupled between said supply potential and said one electrode of said second capacitance means and having a gate electrode receiving said prescribed timing signal,
a fourth switching element coupled between said output terminal and said one electrode of said first capacitance means and having a gate electrode connected to said one electrode of said second capacitance means, and gate means connected between said other electrode of said second capacitance means and said other electrode of said first capacitance means.

10. A semiconductor memory device according to claim 2, wherein said decoding means comprises a driving signal input terminal receiving said driving signal from said driving signal generating means, a plurality of output terminals, and first logic processing means responsive to said prescribed selecting signal for supplying said driving signal from said driving signal input terminal to any selected one of said plurality of output terminals and for applying a ground potential to the rest of said plurality of output terminals.

11. A semiconductor memory device according to claim 10, wherein said plurality of output terminals comprise a first output terminal and a second output terminal, and, said first logic processing means comprises a first switching circuit responsive to a prescribed timing signal for applying said supply potential to said first and second output terminals, a second switching circuit responsive to said prescribed selecting signal for supplying said driving signal from said driving signal input terminal to one of said first and second output terminals, and a third switching circuit responsive to said prescribed selecting signal for applying a ground potential to the other of said first and second output terminals.

12. A semiconductor memory device according to claim 11, wherein said decoder further comprises second logic processing means responsive to said prescribed selecting signal and a prescribed second signal for raising the potential of said driving signal supplied to said first or second output terminal.

13. A semiconductor memory device according to claim 12, wherein said prescribed selecting signal comprises first and second selecting signals complementary with each other, said first switching circuit comprises:

a fifth switching element coupled between said supply potential and said first output terminal and having a gate electrode receiving said prescribed timing signal, and a sixth switching element being coupled between said supply potential and said second output terminal and having a gate electrode receiving said prescribed timing signal, said second switching circuit comprises:

a seventh switching element connected between said driving signal input terminal and said first output terminal and having a gate electrode receiving said second selecting signal, and an eighth switching element connected between said driving signal input terminal and said second output terminal and having a gate electrode receiving said first selecting signal, said third switching circuit comprises:

a ninth switching element coupled between said ground potential and said first output terminal and having a gate electrode receiving said first selecting signal, and a tenth switching element coupled between said group potential and said second output terminal and having a gate electrode receiving said second selecting signal.

14. A semiconductor memory device according to claim 13, wherein said second logic processing means comprises third capacitance means having one electrode connected to said gate electrode of said seventh switching element and having an other electrode, fourth capacitance means having one electrode connected to said gate electrode of said eighth switching element and having an other electrode, first logic gate means responsive to said prescribed second signal and a group potential on said first output terminal for supplying a high level signal to said other electrode of said fourth capacitance means, and second logic gate means responsive to said prescribed second signal and a ground potential on said second output terminal for supplying a high level signal to said other electrode of said third capacitance means.

15. A semiconductor memory device according to claim 2, wherein said sense amplifier means comprises a plurality of sense amplifiers provided corresponding to said plurality of bit line pairs in each of said plurality of memory cell array blocks, and operative responsive to a prescribed activating signal, and each of said plurality of switching means comprises a plurality of switching elements connected between said plurality of bit line pairs in the corresponding memory cell array blocks and said plurality of sense amplifiers and having gate electrodes receiving said driving signal.

16. A semiconductor memory device according to claim 15, wherein each of said switching elements comprise N channel-type MOS transistors.

17. A semiconductor memory device according to claim 16, wherein said driving signal is supplied in an earlier timing than said prescribed activating signal.

18. A method of operating a semiconductor memory device comprising a plurality of memory cell array blocks; sense amplifier means commonly provided for said plurality of memory cell array blocks; and a plurality of switching means connected between said plurality of memory cell array blocks and said sense amplifier means and conductive responsive to a prescribed driving signal, said method comprising the steps of:

generating said driving signal, and supplying said driving signal to a selected one of said plurality of switching means responsive to a prescribed selecting signal, such that said selected one switching means couples said sense amplifier means to a selected memory cell array block.

19. A method of operating a semiconductor memory device comprising a plurality of memory cell array blocks, sense amplifier means commonly provided for said plurality of memory cell array blocks, said method comprising the steps of:

generating a prescribed driving signal;

receiving a prescribed selecting signal;

supplying said prescribed driving signal to a selected one of a plurality of switching means in response to said prescribed selecting signal such that said prescribed driving signal causes said selected one switching means to couple said sense amplifier means to a selected memory cell array block; and sensing with said sense amplifier means data in cells of said selected memory cell array block.

* * * * *